United States Patent
Sander

(10) Patent No.: US 7,449,778 B2
(45) Date of Patent: Nov. 11, 2008

(54) POWER SEMICONDUCTOR MODULE AS H-BRIDGE CIRCUIT AND METHOD FOR PRODUCING THE SAME

(75) Inventor: Rainald Sander, Munich (DE)

(73) Assignee: Infineon Technologies Austria AG (AT)

( * ) Notice: Subject to any disclaimer, the term of this patent is extended or adjusted under 35 U.S.C. 154(b) by 0 days.

(21) Appl. No.: 11/740,630

(22) Filed: Apr. 26, 2007

(65) Prior Publication Data

US 2007/0252265 A1 Nov. 1, 2007

(51) Int. Cl.
*H01L 23/34* (2006.01)
*H01L 23/48* (2006.01)

(52) U.S. Cl. .................. 257/724; 257/723; 257/773; 257/E23.079

(58) Field of Classification Search .............. 257/723, 257/724, 773, E23.079
See application file for complete search history.

(56) References Cited

U.S. PATENT DOCUMENTS

| 5,821,618 A | 10/1998 | Graf et al. .................. 257/723 |
| 6,320,448 B1 * | 11/2001 | Gantioler .................. 327/423 |
| 6,462,929 B2 * | 10/2002 | Compton et al. ............ 361/246 |
| 6,747,300 B2 | 6/2004 | Nadd et al. .................. 257/288 |
| 6,881,071 B2 | 4/2005 | Heilbronner ................ 439/67 |
| 2005/0231925 A1 * | 10/2005 | Fukuda et al. .............. 361/760 |
| 2006/0113664 A1 * | 6/2006 | Shiraishi et al. ............ 257/723 |
| 2006/0244116 A1 * | 11/2006 | Tsunoda .................... 257/678 |

FOREIGN PATENT DOCUMENTS

DE 10121970 B4 5/2004

* cited by examiner

*Primary Examiner*—Ngan Ngo
(74) *Attorney, Agent, or Firm*—Coats & Bennett, P.L.L.C.

(57) ABSTRACT

A power semiconductor module (41) as H-bridge circuit (42) has four power semiconductor chips (N1, N2, P1, P2) and a semiconductor control chip (IC). The semiconductor chips (N1, N2, P1, P2, IC) are arranged on three mutually separate large-area lead chip contact areas (43 to 45) of a lead plane (80). The semiconductor control chip (IC) is arranged on a centrally arranged lead chip contact area (45). An n-channel power semiconductor chip (N1, N2) as low-side switch (58, 59) and a p-channel power semiconductor chip (P1, P2) as high-side switch (48, 49) are in each case arranged on two laterally arranged lead chip contact areas (43, 44). The n-channel power semiconductor chips (N1, N2) are jointly at an earth potential (50) and the p-channel power semiconductor chips (P1, P2) are electrically connected to separate supply voltage sources (VS1, VS2).

16 Claims, 2 Drawing Sheets

POWER SEMICONDUCTOR MODULE AS H-BRIDGE CIRCUIT AND METHOD FOR PRODUCING THE SAME

RELATED APPLICATION

This application claims priority from German Patent Application No. DE 10 2006 020 243.0, which was filed on Apr. 27, 2006, and is incorporated herein by reference in its entirety.

TECHNICAL FIELD

The invention relates to a power semiconductor module as H-bridge circuit.

BACKGROUND

The H-bridge circuit can be composed of two half-bridge circuits. For this purpose, the power semiconductor module has four power semiconductor chips.

The document U.S. Pat. No. 5,821,618 discloses a power semiconductor module, the power semiconductor module having an insulating housing, in which a multiplicity of metal mounting plates are arranged in a plane and are electrically insulated from one another in the housing. Semiconductor switches of a rectifier bridge are electrically conductively mounted on the metal mounting plates. Connecting leads are electrically connected to the semiconductor switches, at least one connecting lead being electrically connected to the metal mounting plates.

Said power semiconductor module has the disadvantage that the connecting leads project as lead pins far from the housing and are individually anchored in the housing by one end, such that there is the risk of the connecting leads breaking out from the housing in the event of mechanical loading, which jeopardizes the reliability of the bridge circuit.

What is more, the mechanical construction of the H-bridge circuit that is known from U.S. Pat. No. 5,821,618 requires various power semiconductor chips mounted in a special leadframe. For the mechanical construction of the known H-bridge circuit, use is made in this case of two separate low-side switches and a double high-side switch in the form of power semiconductor chips which are mounted on mutually insulated lead mounting plates. For this purpose, the double high-side switch is mounted on a central lead mounting plate, while the low-side switches are mechanically and electrically fixed on two lead mounting plates arranged laterally with respect to the central lead mounting plate. This H-bridge circuit is controlled via the gate electrodes of the power semiconductor chips, with the result that additional external drive circuits disadvantageously become necessary for specific applications.

SUMMARY

An improved mechanical construction of an H-bridge circuit can be provided, which can be produced cost-effectively and can be subjected to higher mechanical loading. Furthermore, the reliability of the H-bridge circuit and the usability of the H-bridge circuit can be improved and extended.

According to an embodiment, a power semiconductor module as H-bridge circuit may comprise four power semiconductor chips and a semiconductor control chip, the semiconductor chips being arranged on three mutually separate large-area lead chip contact areas of a lead plane, having a centrally arranged lead chip contact area, on which the semiconductor control chip is arranged, and two laterally arranged lead chip contact areas, on each of which are arranged an n-channel power semiconductor chip as low-side switch and a p-channel power semiconductor chip as high-side switch, and the n-channel power semiconductor chips being jointly electrically connected to an earth potential and the p-channel power semiconductor chips being electrically connected to separate supply voltage sources.

BRIEF DESCRIPTION OF THE DRAWINGS

The invention will now be explained in more detail with reference to the accompanying figures.

FIG. 1 shows a basic circuit diagram of an H-bridge circuit according to an embodiment;

FIG. 2 shows a schematic construction of the H-bridge circuit in accordance with FIG. 1 as a power semiconductor module.

DETAILED DESCRIPTION

According to an embodiment, a power semiconductor module can be provided as an H-bridge circuit having four power semiconductor chips and a semiconductor control chip. For this purpose, the semiconductor chips are arranged on three mutually separate large-area lead chip contact areas of a lead plane in a housing. For this purpose, the lead plane has a centrally arranged lead chip contact area, on which the semiconductor control chip is arranged, and two lead chip contact areas which are arranged laterally with respect thereto and on which are arranged in each case an n-channel power semiconductor chip as low-side switch and a p-channel power semiconductor chip as high-side switch. In this case, the n-channel power semiconductor chips are jointly electrically connected to an earth potential and the p-channel power semiconductor chips are electrically connected to separate supply voltage sources.

The power semiconductor module according to an embodiment has the advantage that its construction is greatly simplified in comparison with a conventional module in that a half-bridge comprising an n-channel power semiconductor chip and a p-channel power semiconductor chip is arranged on the respective lateral lead chip contact areas, and the two half-bridges are controlled by the central semiconductor control chip on the central lead chip contact area for a full-bridge function. This additional semiconductor control chip significantly improves the functionality and the possibility for use of the power semiconductor module in comparison with a conventional module.

According to an embodiment, fabrification can be simplified by virtue of the fact that the five semiconductor chips can be mounted on a single lead plane, with the result that an inexpensive leadframe can be used. Moreover, the reliability of the power semiconductor module is significantly improved, according to an embodiment, at least from a mechanical standpoint since large-area lead chip contacts are provided which are anchored with the housing in large-area and mechanical fashion and which can be accessed externally without mechanically sensitive lead pins.

In one embodiment, contact areas on the top sides of the semiconductor chips are electrically connected via individual bonding wires for control signal transfer between the central semiconductor control chip and the four laterally arranged power semiconductor chips. This improves the controllability of the H-bridge circuit and enables a greater variation range for the area of use of this H-bridge circuit according to an embodiment.

Figure 1:
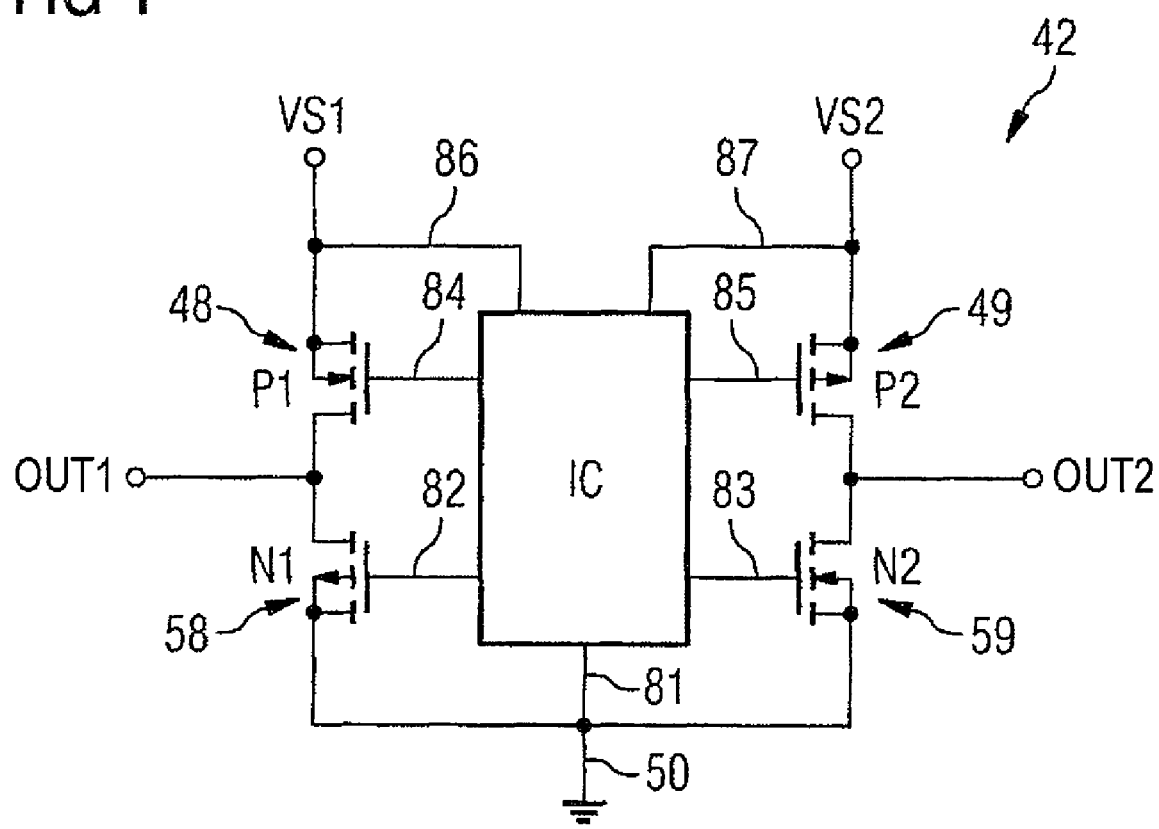

In addition to the signal transfer within the power semiconductor module and a signal transfer externally to the semiconductor control chip, it is furthermore provided that the large-area contact areas on the top sides of the power semiconductor chips are connected via a multiplicity of parallel-connected bonding wires to a respective one of the large-area lead contact areas on the lead plane.

This multiplicity of bonding wires makes it possible to distribute the current loading of the large-area contact areas between a multiplicity of bonding wire connections in order to conduct the currents to be switched between the large-area contact areas on the top side of the power semiconductor chips and the lead contact areas without thermal overloading.

An alternative possibility, according to an embodiment, consists in connecting the large-area contact areas on the top side of the power semiconductor chips via bonding tapes to a respective large-area lead contact area on the lead plane. This bonding tape solution has the advantage over a multiplicity of bonding wires that a fabrication-technological simplification results, especially as the production of bonding wire connections is a serial operation that can be combined by means of the bonding tapes to form a single bonding step.

In a further embodiment, for producing large-area electrical connections, it is possible to use conductor clips which are electrically conductively connected by a conductive adhesive to the large-area contact areas on the top side of the power semiconductor chips and the large-area lead contact areas on the lead plane. However, this solution presupposes that correspondingly previously prepared conductor clips are ready which can then be used in fabrication-technological fashion. The power semiconductor module preferably has leads arranged in a plane as surface-mountable external contacts on the underside.

It is furthermore possible, according to an embodiment, for 36 edge side contacts to be provided on two mutually opposite edge sides of the semiconductor module. In contrast to conventional modules, wherein individual lead pins are anchored in a plastic housing composition by one end and project from the plastic housing composition by the other end, this solution of the edge side contacts has the advantage that the edge side contacts can be subjected to significantly higher mechanical loading, especially as they only constitute a lengthening of the large-area external contacts on the underside of the semiconductor module as far as the edge sides. Accordingly, they are held mechanically by the respective large-area external contact.

Correspondingly, one embodiment of the power semiconductor module has 36 edge side contacts, a first output terminal having the edge side contacts 1 to 4 and 33 to 36, which lie opposite one another. A second output terminal has the edge side contacts 15 to 18 and 19 to 22, which likewise lie exactly opposite one another in the edge region of the semiconductor module. A first supply terminal has the edge side contacts 29 to 32 and a second supply terminal has the edge side contacts 11 to 14, said supply terminals being arranged such that they are electrically insulated from the output terminals. Finally, the central lead terminal has an earth terminal, which is electrically connected to the edge side contacts 5 to 8 and 23 to 26. Only the edge side contacts 9, 11, 27 and 28 are formed as signal external terminals and are electrically connected to the semiconductor control chip via corresponding bonding wire connections.

Both the n-channel power semiconductor chips and the p-channel power semiconductor chips, according to an embodiment, can be preferably FET transistors using vertical MOS technology. Such FET transistors having vertical drift paths can be used for relatively high supply voltages, in particular in the region of several kilovolts.

A further construction of a power semiconductor module according to an embodiment provides for the low-side switches to be cohesively and electrically conductively connected by their source contacts and gate contacts to a respective output terminal on the respective lead chip contact areas, with the result that their drain electrodes arranged on the opposite side are freely accessible and can be connected via corresponding bonding tapes to the provided earth potential of the central lead chip contact area, with the result that the low-side switches are electrically connected to the earth terminal by their freely accessible drain contacts via connecting elements and via the central lead chip contact area.

The high-side switches with their drain contacts are cohesively and electrically conductively connected to a respective output terminal on the respective lead chip contact areas according to an embodiment. Consequently, according to an embodiment, the source electrodes and gate electrodes arranged on the opposite side of the power semiconductor chips for the high-side switches are freely accessible. While the gate electrodes are connected to contact areas of the central semiconductor control chip via bonding wire connections, the large-area contact areas of the source electrodes are cohesively and electrically conductively connected via bonding tapes to a respective supply voltage terminal on the respective lead external contacts.

A multiplicity of contact areas of the semiconductor control chips are electrically connected via bonding wire connections to the gate contacts and the source contacts of the high-side switches, and also to the drain contacts of the low-side switches, whereby the possibilities for application of the power semiconductor module according to an embodiment are significantly extended.

Furthermore, according to an embodiment, contact areas of the semiconductor control chip are electrically connected via bonding wire connections on the one hand to the earth potential and on the other hand to signal external contacts of the power semiconductor module. The power semiconductor module can be accessed via said signal external contacts. Furthermore, according to some embodiments, different applications of the power semiconductor module can be utilized. For this purpose, the external contact areas of the power semiconductor module form a planar structured lead plate of a leadframe.

According to an embodiment, the power semiconductor module may have preferably a housing composed of a plastic housing composition, into which are embedded the power semiconductor chips, the semiconductor control chip, the connecting elements and the external contacts whilst leaving free external and edge contact areas on the underside and the edge sides of the power semiconductor module.

According to a further embodiment, a method for producing a plurality of power semiconductor modules as H-bridge circuit having four power semiconductor chips and a semiconductor control chip may have the following method steps.

The first step involves producing a leadframe having a plurality of power semiconductor module positions. Three large-area lead chip contact areas and two lead contact areas for supply terminals and four lead contact areas for control signal terminals are provided in the power semiconductor module positions. In this case, the first large-area lead chip contact area is provided for an n-channel power semiconductor chip as low-side switch with a p-channel power semiconductor chip as high-side switch of a first half-bridge. The second lead chip contact area is reserved for the power semiconductor chips of the second half-bridge of the H-bridge circuit, and the third central lead contact area is provided for the semiconductor control chip with earth terminal.

After the production of such a leadframe, the power semiconductor chips and the semiconductor control chip are applied to the provided large-area lead chip contact areas of the leadframe. After the five semiconductor chips have in each case been fixed and positioned in the power semiconductor module positions of the leadframe, connecting elements are applied between contact areas of the semiconductor chips and the lead contact areas and also between contact areas of the semiconductor chips among one another.

Finally, the power semiconductor chips, the semiconductor control chip, the connecting elements and the lead contact areas are then packaged into a plastic housing composition whilst leaving free external contact areas of the lead terminals of the leadframe. The leadframe can then be separated into individual power semiconductor modules.

This method has the advantage that a plurality of power semiconductor modules can be produced simultaneously in a parallel method using a leadframe and a multiplicity of lead module positions. This method furthermore has the advantage that only one planar metal plate is necessary for the production of the leadframe. For this purpose, preferably a metal plate composed of copper or a copper alloy is structured. The structuring may be effected by stamping, which has the advantage of mass production, or it may be effected by wet etching, in the course of which the edges of the individual lead plate regions receive a contour that facilitates an anchoring of the lead regions on the underside of a plastic housing for the power semiconductor module. A further possibility of structuring such a metal plate to form a leadframe consists in dry etching, which can be carried out by means of plasma sputtering. An alternative method for producing a leadframe consists in electrodepositing the leadframe structure on an auxiliary carrier and subsequently detaching or removing the leadframe from the auxiliary carrier or resolving the auxiliary carrier itself.

According to further embodiments, for the application of the power semiconductor chips and the semiconductor control chip to the large-area lead chip contact areas provided, said semiconductor chips may be soldered or adhesively bonded onto the lead chip contact areas.

According to further embodiments, various methods are available for the fitting of connecting elements between contact areas of the semiconductor control chip and the lead contact areas, and also between contact areas of the semiconductor control chip and contact areas of the power semiconductor chips. One of the least expensive methods would be bonding involving the production of bonding wire connections. On the other hand, it is advantageous to produce connecting elements between contact areas of the power semiconductor chips and the lead contact areas by multiple wire bonding or by fitting bonding clips or finally by bonding of bonding tapes.

Each of said methods, according to further embodiments, has its advantages and disadvantages, the fitting of bonding tapes being a method in which bonding tape connections can be produced in rapid succession, while the fitting of bonding clips is associated with the fact that bonding clips of this type are to be produced individually and mounted individually appropriately for each power semiconductor module.

The separation of the leadframe into individual power semiconductor modules is preferably effected by means of a stamping method according to one embodiment. However, it is also possible to carry out the separation by means of an etching method according to another embodiment.

FIG. 1 shows a basic circuit diagram of an H-bridge circuit 42 according to an embodiment, which is composed of two half-bridge circuits and is linked via a semiconductor control chip IC to form a controllable H-bridge circuit 42. For this purpose, each half-bridge circuit has an n-channel power semiconductor chip N1 as low-side switch 58, said chip being arranged between an earth terminal 50 and a high-side switch 48, the high-side switch 48 having a p-channel power semiconductor chip P1 connected to a first supply voltage source VS1. A first output terminal OUT1 is tapped off between the first low-side switch N1 and the first high-side switch P1.

On the opposite side to the first half-bridge, the second half-bridge is arranged comprising a second low-side switch 59, which is formed as a second n-channel power semiconductor chip N2 and is connected between an earth terminal 50 and a second high-side switch 49, the high-side switch 49 having a p-channel power semiconductor chip P2, which for its part is connected to a second voltage supply source VS2. A second output terminal OUT2 is present between the low-side switch 59 and the high-side switch 49. The earth potential 50 is also applied to the semiconductor control chip IC via the line 81. The gate electrodes of the power semiconductor chips N1, N2, P1 and P2 are connected to the semiconductor control chip IC via the signal lines 82, 83, 84 and 85 and the semiconductor control chip IC is connected to the supply voltage sources VS1 and VS2 via the signal lines 86 and 87.

Figure 2:
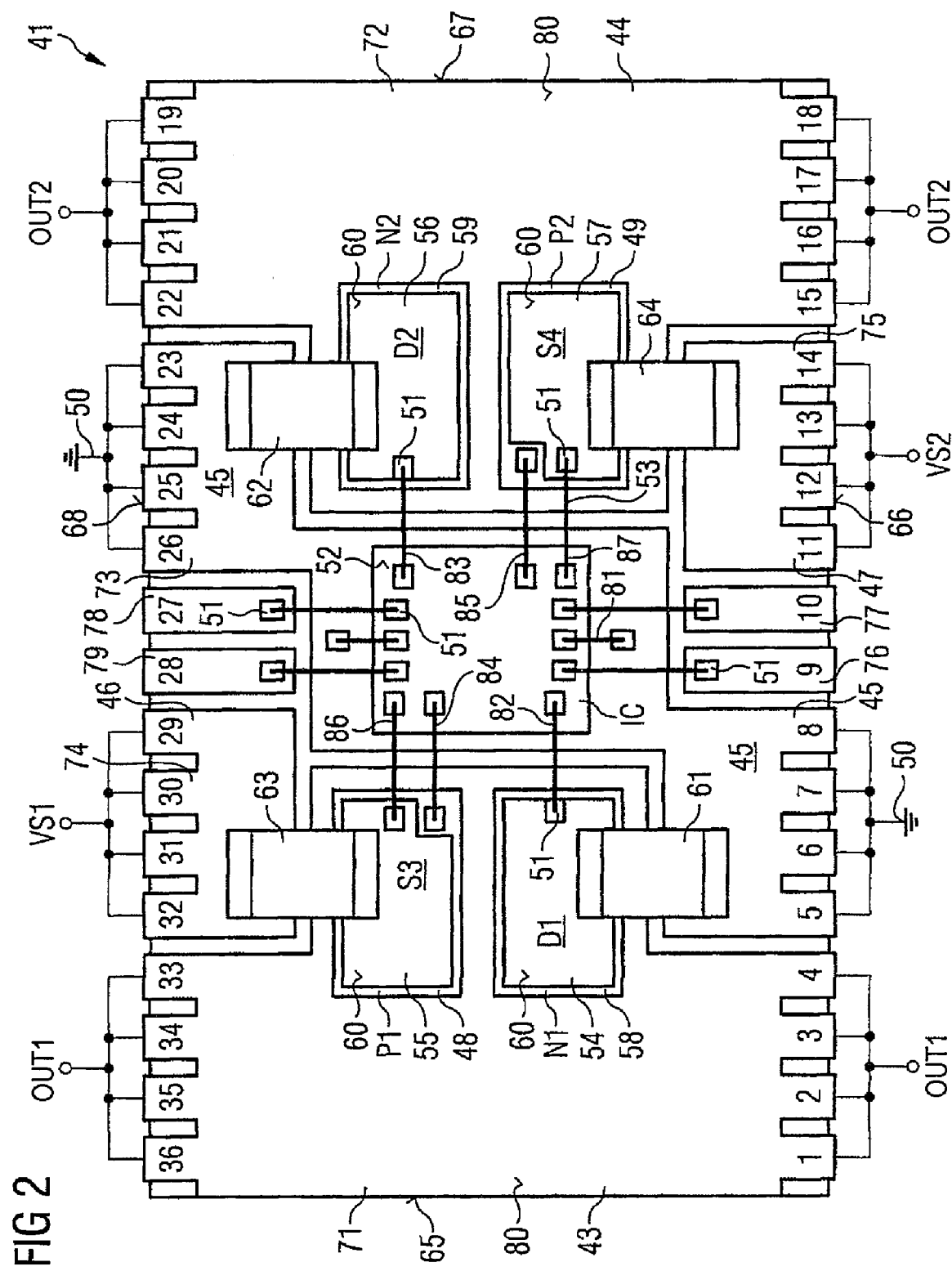

FIG. 2 shows a schematic construction of the H-bridge circuit 42 in accordance with FIG. 1 as power semiconductor module 41. The power semiconductor module 41 has 36 edge side contacts 1 to 36 on the edge sides 66 and 68, the edge side contacts 1 to 18 being arranged on the edge side 66, and the edge side contacts 19-36 being arranged on the edge side 68. A portion of the edge side contacts are combined to form large-area lead external contacts 71 to 75, which form, on a lead plane 80 in the interior of the power semiconductor module 41, a large-area lead chip contact area 43 for the first half-bridge of the H-bridge circuit and a lead chip contact area 44 for the second half-bridge of the H-bridge circuit.

In each case a low-side switch 58 and 59 and a high-side switch 48 and 49 are arranged on said lead chip contact areas 43 and 44, respectively. In this case, the low-side switches 58 and 59 are formed as n-channel power semiconductor chips N1 and N2 and are electrically conductively fixed by their source and drain electrodes to the large-area lead chip contact area 43 and 44, respectively, either by means of a soldering connection or by means of an adhesive connection. By contrast, the p-channel power semiconductor chips P1 and P2 serving as high-side switches 48 and 49 are in each case arranged with their drain contact areas on the large-area lead chip contact areas 43 and 44.

The two large-area lead chip contact areas 43 and 44 are situated in the edge region of the right-hand edge side 65 and the left-hand edge side 67, respectively, and have in each case 8 edge side contacts, to which a first output OUT1 can be connected on the left-hand edge side 65 and a second output OUT2 can be connected on the right-hand edge side 67. For this purpose, the edge side contacts 1 to 4 and 33 to 36 are available for the first output terminal OUT1 with the external contact 71, while the edge side contacts 15 to 18 and 19 to 22 are available for the second output terminal OUT2 with the external contact 72. As already mentioned, the power semiconductor chips N1 and P1, and N2 and P2 are arranged on the associated large-area lead chip contact areas 43 and 44, respectively, and are connected to further lead contact areas 45, 46 and 47 via bonding tapes 61 to 64.

The freely accessible top sides 60 of the power semiconductor chips N1, N2, P1 and P2 have large-area contact areas 54 to 57. In this case, the first power semiconductor chip N1 is connected by its drain electrode D1 on the top side 60 via the bonding tape 61 to the central lead chip contact area 45, which for its part is connected to earth potential 50 by the edge side contacts 5 to 8 and 23 to 26 of the external contact 73. The second low-side switch N2 of the second half-bridge is also connected to the earth potential 50 by its drain electrode D2 on its top side 60 with the aid of a bonding tape 62 via the central lead chip contact area 45.

By contrast, the source electrode S3 on the top side 60 of the first p-channel power semiconductor chip P1 of the first half-bridge is connected to the first supply voltage source VS1 via a bonding tape 63 and the external contact 74, while the second p-channel power semiconductor chip P2 is connected by its source electrode S4 on its top side 60 to the second supply voltage source VS2 via the bonding tape 64 and the external contact 75. The connecting lines 81 to 87, which are shown in FIG. 1, are realized by bonding wires 53 in this construction of the power semiconductor module. Further bonding wire connections 53 exist between contact areas 51 on the top side 52 of the semiconductor control chip IC and the signal external contacts 76 to 79.

LIST OF REFERENCE SYMBOLS 1-36 External contacts of the power semiconductor module
41 Power semiconductor module
42 H-bridge circuit
43 Lead chip contact area (lateral)
44 Lead chip contact area (lateral)
45 Lead chip contact area (central)
46 Lead contact area (VS1)
47 Lead contact area (VS2)
48 High-side switch
49 High-side switch
50 Earth potential or earth terminal
51 Contact area for signal transfer
52 Top side of the semiconductor control chip
53 Bonding wire
54-57 Large-area contact area
58 Low-side switch
59 Low-side switch
60 Top side of the power semiconductor chips
61-64 Bonding tape
65-68 Edge sides of the power semiconductor chip
71-75 External contact
76-79 Signal external contact
80 Lead plane
81-87 Signal connecting lines
N1 Power semiconductor chip
N2 Power semiconductor chip
P1 Power semiconductor chip
P2 Power semiconductor chip
IC Semiconductor control chip
vS1 Supply source
VS2 Supply source
D1 Drain contact of N1
D2 Drain contact of N2
S3 Source contact of P1
S4 Source contact of P2
OUT1 First output terminal
OUT2 Second output terminal

What is claimed is:

1. A power semiconductor module as H-bridge circuit comprising four power semiconductor chips and a semiconductor control chip, the semiconductor chips being arranged on three mutually separate large-area lead chip contact areas of a lead plane, having a centrally arranged lead chip contact area, on which the semiconductor control chip is arranged, and two laterally arranged lead chip contact areas, on each of which are arranged an n-channel power semiconductor chip as low-side switch and a p-channel power semiconductor chip as high-side switch, and the n-channel power semiconductor chips being jointly electrically connected to an earth potential and the p-channel power semiconductor chips being electrically connected to separate supply voltage sources.

2. The power semiconductor module according to claim 1, wherein contact areas on the top sides of the semiconductor chips are electrically connected via individual bonding wires for control signal transfer between the central semiconductor control chip and the four laterally arranged power semiconductor chips.

3. The power semiconductor module according to claim 1, wherein large-area contact areas on the top sides of the power semiconductor chips are connected via a multiplicity of parallel bonding wires to a respective one of the large-area lead contact areas on the lead plane.

4. The power semiconductor module according to claim 1, wherein large-area contact areas on the top sides of the power semiconductor chips are connected via bonding tapes to a respective large-area lead contact area on the lead plane.

5. The power semiconductor module according to claim 1, wherein large-area contact areas on the top sides of the power semiconductor chips are connected via conductor clips to a respective large-area lead contact area on the lead plane.

6. The power semiconductor module according to claim 1, wherein the power semiconductor module has leads arranged in a plane as surface-mountable external contacts on the underside of the power semiconductor module, which merge into edge side contacts on the edge sides.

7. The power semiconductor module according to claim 1, wherein the power semiconductor module comprises 36 edge side contacts, a first output terminal comprising the edge side contacts 1 to 4 and 33 to 36, a second output terminal comprising the edge side contacts 15 to 18 and 19 to 22, a first supply terminal comprising the edge side contacts 29 to 32, a second supply terminal comprising the edge side contacts 11 to 14 and an earth terminal comprising the edge side contacts 5 to 8 and 23 to 26, while the edge side contacts 9 and 11 and 27 and 28 are signal external terminals.

8. The power semiconductor module according to claim 1, wherein the power semiconductor module comprises FET transistors as power semiconductor chips.

9. The power semiconductor module according to claim 1, wherein the low-side switches are cohesively and electrically conductively connected by their source contacts and gate contacts respectively to an output terminal on the respective lead chip contact areas.

10. The power semiconductor module according to claim 1, wherein the low-side switches are electrically connected by their drain contacts to the earth terminal via connecting elements and via the central lead chip contact area.

11. The power semiconductor module according to claim 1, wherein the high-side switches are cohesively and electrically conductively connected by their drain contacts respectively to an output terminal on the respective lead chip contact areas.

12. The power semiconductor module according to claim 1, wherein the high-side switches are cohesively and electrically conductively connected by their source contacts via connecting elements respectively to a supply voltage terminal on the respective lead external contacts.

13. The power semiconductor module according to claim 1, wherein contact areas of the semiconductor control chip are connected via bonding wire connections to the gate contacts and the source contacts of the high-side switches, and also to the drain contacts of the low-side switches.

14. The power semiconductor module according to claim 1, wherein contact areas of the semiconductor control chip are connected via bonding wire connections to signal external contacts of the power semiconductor module.

15. The power semiconductor module according to claim 1, wherein the external contacts of the power semiconductor module are a planar structured lead plate of a leadframe.

16. The power semiconductor module according to claim 1, wherein the power semiconductor module comprises a housing composed of a plastic housing composition, into which are embedded the power semiconductor chips, the semiconductor control chip, the connecting elements and the external contacts whilst leaving free external and edge contact areas on the underside and the edge sides of the power semiconductor module.

* * * * *